United States Patent
Hou et al.

(10) Patent No.: US 7,816,984 B2
(45) Date of Patent: Oct. 19, 2010

(54) LOOKUP TABLE GENERATION METHOD AND RELATED DEVICE FOR A PREDISTORTER

(75) Inventors: Wen-Sheng Hou, Hsinchu County (TW); Yun-Shen Chang, Hsinchu County (TW); Chun-Hsien Wen, Hsinchu County (TW); Jiunn-Tsair Chen, Hsinchu County (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 56 days.

(21) Appl. No.: 12/432,767

(22) Filed: Apr. 30, 2009

(65) Prior Publication Data

US 2010/0097137 A1 Apr. 22, 2010

(30) Foreign Application Priority Data

Oct. 20, 2008 (TW) .............................. 97140189 A

(51) Int. Cl.
*H03F 1/26* (2006.01)
(52) U.S. Cl. ...................................................... 330/149
(58) Field of Classification Search .................. 330/2, 330/149; 455/114.3
See application file for complete search history.

(56) References Cited

U.S. PATENT DOCUMENTS

| | | | |
|---|---|---|---|
| 6,600,792 B2* | 7/2003 | Antonio et al. | 375/297 |
| 7,720,171 B2* | 5/2010 | Honcharenko et al. | 375/295 |

* cited by examiner

*Primary Examiner*—Robert Pascal
*Assistant Examiner*—Khiem D Nguyen
(74) *Attorney, Agent, or Firm*—Winston Hsu; Scott Margo; Min-Lee Teng

(57) ABSTRACT

A lookup table generation method for a predistorter comprises sending a first single tone signal with a maximum expected amplitude to a channel simulation device including the power amplifier, estimating a closed loop gain and a closed loop phase of the power amplifier according to the first single tone signal and a first simulation output signal generated outputted by the channel simulation device, sending a plurality of single tone signals to the channel simulation device, each single tone signal having an amplitude different from all others of the plurality of single tone signals and lower than the maximum expected amplitude, generating a plurality of predistortion parameters according to the closed loop gain, the closed loop phase, the plurality of single tone signals and a plurality of simulation output signals outputted by the channel simulation device, and storing the plurality of predistortion parameters in a lookup table of the predistorter.

10 Claims, 7 Drawing Sheets

LOOKUP TABLE GENERATION METHOD AND RELATED DEVICE FOR A PREDISTORTER

BACKGROUND OF THE INVENTION

1. Field of the Invention

The present invention relates to a lookup table generation method and related device for a predistorter, and more particularly, to a lookup table generation method and related device for generating a plurality of predistortion parameters through a plurality of single tone signals sent to a channel simulation device.

2. Description of the Prior Art

A power amplifier is the most important component in radio frequency circuitry of a wireless communications system. A power amplifier with high output power usually exhibits output power saturation and low output linearity, which results in decreased output signal quality. It is therefore an important issue to avoid output signal distortion and enhance output linearity of the power amplifier.

The nonlinearity of a power amplifier relates to an input power of the power amplifier and can be realized by AM/AM and AM/PM characteristics shown in FIG. 1 and FIG. 2. As shown in FIG. 1, the AM/AM characteristic shows the nonlinearity of output amplitude to input amplitude. When input power exceeds a certain level, output power enters a saturation state and does not increase corresponding to the input power. As shown in FIG. 2, the AM/PM characteristic shows the nonlinearity of output phase to input amplitude. When the input power exceeds a certain level, output phase shifts according to the input power.

A digital predistortion method which performs digital signal processing on baseband signals through a predistorter reduces nonlinearity and signal distortion. Please refer to FIG. 3, which is a schematic diagram of a communications transmitter 30 using a digital predistorter according to the prior art. The communications transmitter 30 comprises a predistorter 300, a D/A converter 302, an up converter 304, a power amplifier 306 and an antenna 308. The predistorter 300 comprises an amplitude estimation unit 310, a lookup table 312 for storing predistortion parameters, and a predistortion unit 314. When a baseband signal is transmitted to the predistorter 300, the amplitude estimation unit 310 estimates amplitude of the baseband signal and outputs a value of the amplitude to the lookup table 312. The lookup table 312 decides a proper predistortion parameter for the estimated amplitude, then the predistortion unit 314 performs a predistortion process on the baseband signal according to the predistortion parameter, for generating a compensated signal. In other words, the predistorter 300 is utilized for compensating the baseband signal according to the predistortion parameter. The D/A converter 302 converts the compensated signal generated by the predistorter 300 to an analog signal. The up converter 304 transfers a frequency of the analog signal to a frequency appropriate for the antenna 308 to transmit. Finally, the power amplifier 306 amplifies the analog signal and the antenna 308 transmits the analog signal to the air.

In the predistorter 300, the predistortion parameters are designed according to AM/AM and AM/PM characteristics, so the compensated signal is able to improve output linearity of the power amplifier in advance. However, it is not efficient enough, thus closed loop delay of the power amplifier should be estimated before the predistortion parameters are generated.

SUMMARY OF THE INVENTION

It is therefore a primary objective of the claimed invention to provide a lookup table generation method and related device for a predistorter for a power amplifier.

The present invention discloses a lookup table generation method for a predistorter for a power amplifier. The lookup table generation method comprises sending a first single tone signal with a maximum expected amplitude to a channel simulation device including the power amplifier, receiving a first simulation output signal corresponding to the first single tone signal from the channel simulation device, estimating a closed loop gain and a closed loop phase of the power amplifier according to the first single tone signal and the first simulation output signal, sending a plurality of single tone signals to the channel simulation device, each single tone signal having an amplitude different from all others of the plurality of single tone signals and lower than the maximum expected amplitude, receiving a plurality of simulation output signals corresponding to the plurality of single tone signals from the channel simulation device, generating a plurality of predistortion parameters according to the closed loop gain, the closed loop phase, the plurality of single tone signals and the plurality of simulation output signals, and storing the plurality of predistortion parameters in a lookup table of the predistorter.

The present invention further discloses a predistortion parameter generator for a power amplifier. The predistortion parameter generator comprises a channel simulation device comprising the power amplifier, a signal generator, an estimation unit and a parameter generation unit. The channel simulation device is utilized for generating a first simulation output signal according to a first single tone signal with a maximum expected amplitude and generating a plurality of simulation output signals according to a plurality of single tone signals, wherein each single tone signal has an amplitude different from all others of the plurality of single tone signals and lower than the maximum expected amplitude. The signal generator is coupled to the channel simulation device and is utilized for generating the first single tone signal and the plurality of single tone signals sent to the channel simulation device. The estimation unit is coupled to the channel simulation device and the signal generator and is utilized for estimating a closed loop gain and a closed loop phase of the power amplifier according to the first single tone signal and the first simulation output signal. The parameter generation unit is coupled to the signal generator, the estimation unit and the channel simulation device, and is utilized for generating a plurality of predistortion parameters according to the closed loop gain, the closed loop phase, the plurality of single tone signals and the plurality of simulation output signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
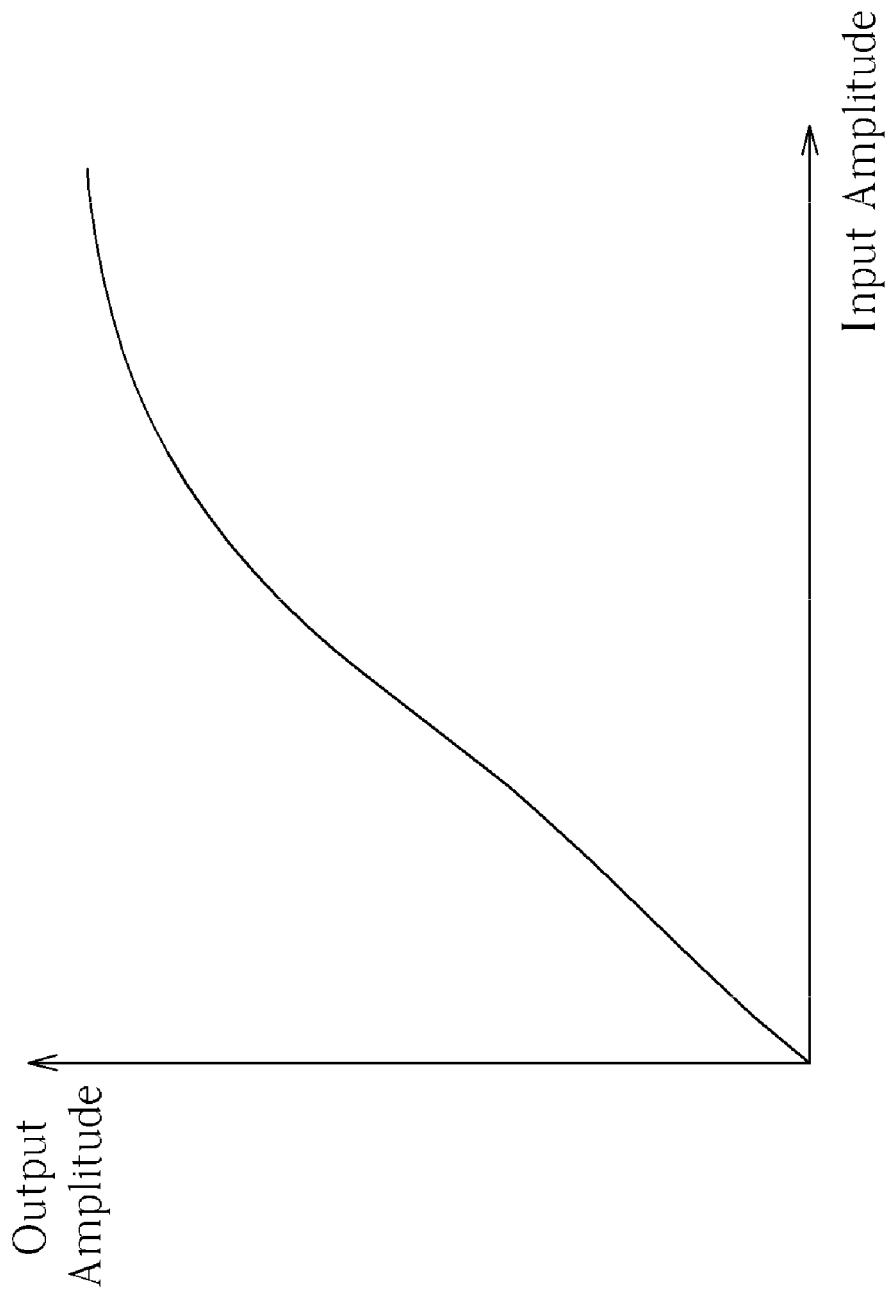
FIG. 1 is a diagram illustrating AM/AM characteristic of a power amplifier according to the prior art.
Figure 2:
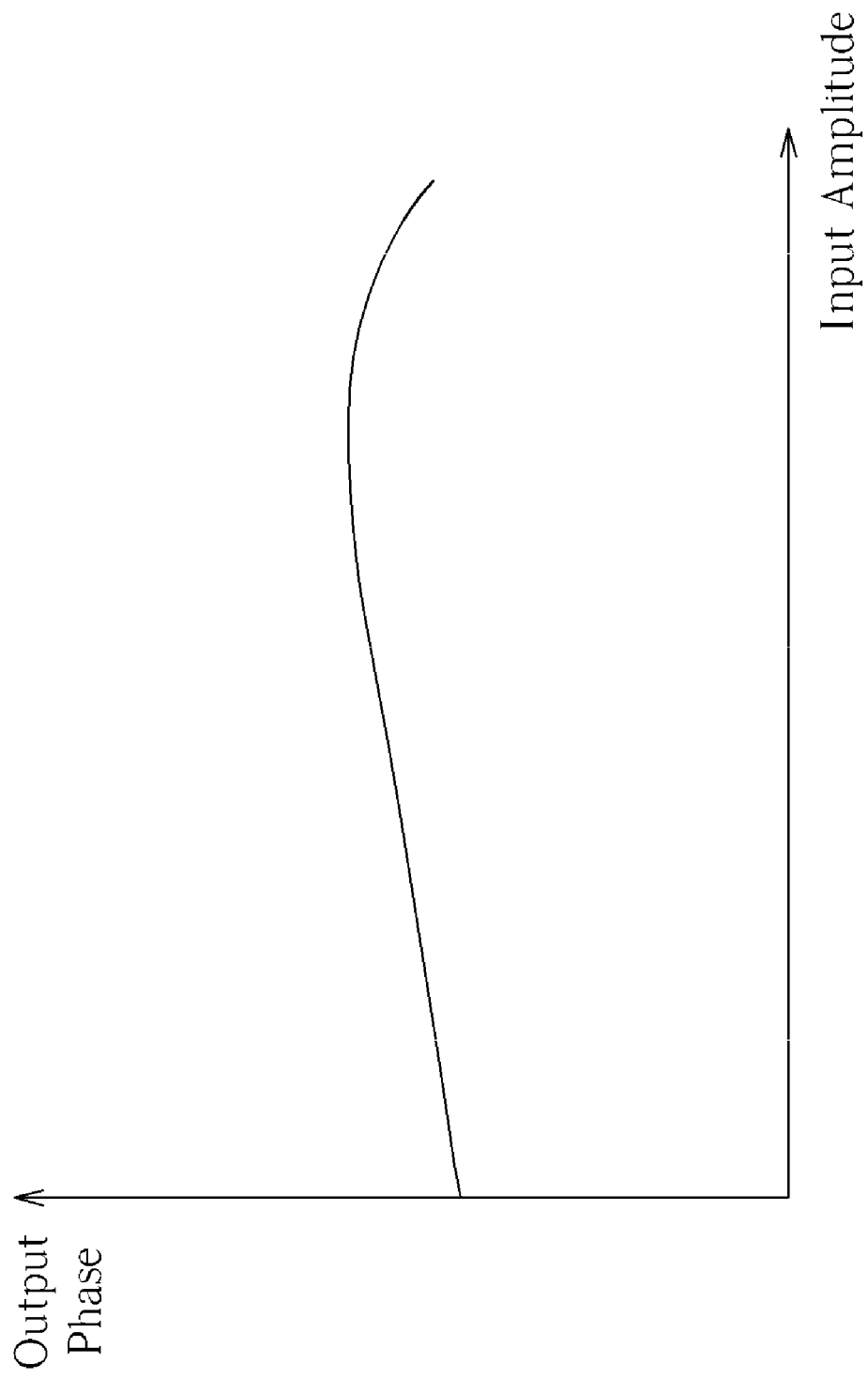
FIG. 2 is a diagram illustrating AM/PM characteristic of a power amplifier according to the prior art.
Figure 3:
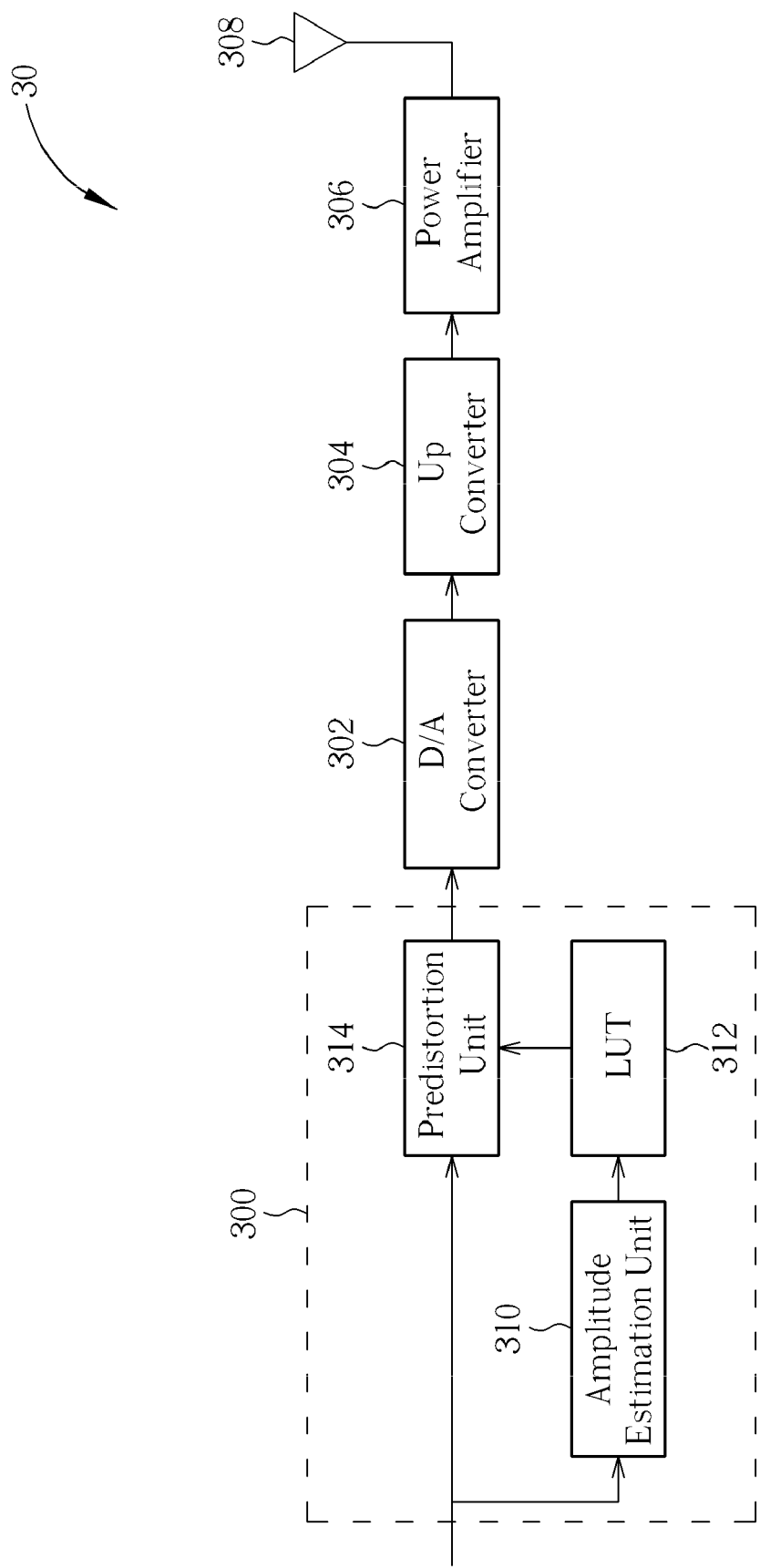
FIG. 3 is a schematic diagram of a communications transmitter using a digital predistorter according to the prior art.
Figure 4:
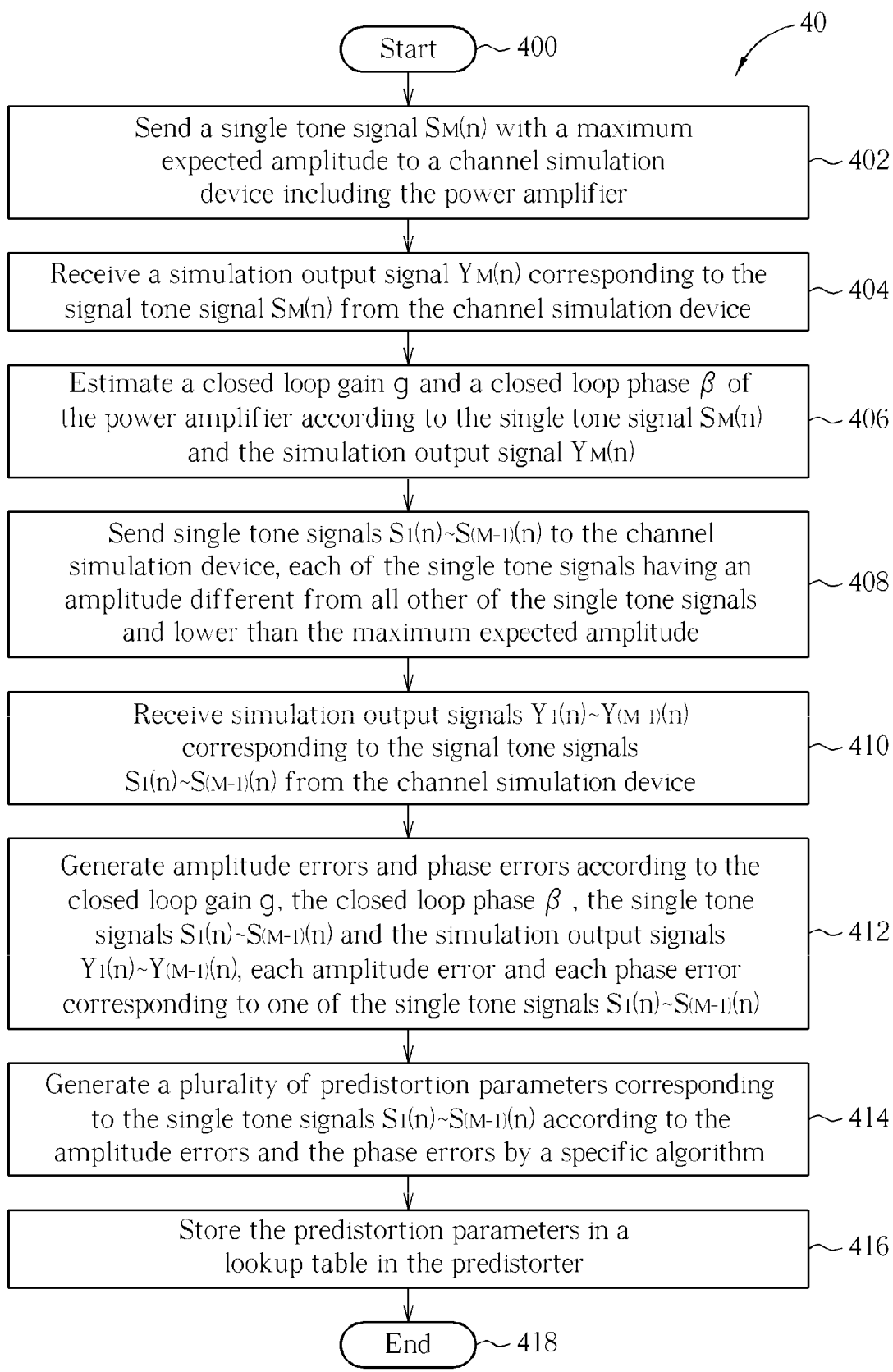
FIG. 4 is a flowchart of a process according to an embodiment of the present invention.

Please refer to FIG. 4, which is a flowchart of a process 40 according to an embodiment of the present invention. The process 40 is utilized in a predistorter used for improving output linearity of a power amplifier in a transmitter of a communication system, for generating a lookup table of predistortion parameters used by the predistorter. The process 40 comprises the following steps:

Step 400: Start.

Step 402: Send a single tone signal $S_M(n)$ with a maximum expected amplitude to a channel simulation device including the power amplifier.

Step 404: Receive a simulation output signal $Y_M(n)$ corresponding to the single tone signal $S_M(n)$ from the channel simulation device.

Step 406: Estimate a closed loop gain g and a closed loop phase β of the power amplifier according to the single tone signal $S_M(n)$ and the simulation output signal $Y_M(n)$.

Step 408: Send single tone signals $S_1(n) \sim S_{(M-1)}(n)$ to the channel simulation device, each of the single tone signals having an amplitude different from all other of the single tone signals and lower than the maximum expected amplitude.

Step 410: Receive simulation output signals $Y_1(n) \sim Y_{(M-1)}(n)$ corresponding to the single tone signals $S_1(n) \sim S_{(M-1)}(n)$ from the channel simulation device.

Step 412: Generate amplitude errors and phase errors according to the closed loop gain g, the closed loop phase β, the single tone signals $S_1(n) \sim S_{(M-1)}(n)$ and the simulation output signals $Y_1(n) \sim Y_{(M-1)}(n)$, each amplitude error and each phase error corresponding to one of the single tone signals $S_1(n) \sim S_{(M-1)}(n)$.

Step 414: Generate a plurality of predistortion parameters corresponding to the single tone signals $S_1(n) \sim S_{(M-1)}(n)$ according to the amplitude errors and the phase errors by a specific algorithm.

Step 416: Store the plurality of predistortion parameters in a lookup table in the predistorter.

Step 418: End.

Please note that the process 40 is utilized for generating the lookup table storing the predistortion parameters used by the predistorter. After the lookup table is generated, baseband signals in the communication system are predistorted accordingly. During the process 40, the predistorter does not do any predistortion process on signals, so input signals of the predistorter are equal to output signals of the predistorter. The channel simulation device is formed by parts of the transmitter and parts of a receiver, and is used for feeding transmitted signals back to the receiver, for simulating influences resulting from the communication system, such as amplification and attenuation, on signals. Through the channel simulation device, the predistorter can get the difference between an ideal output signal of the power amplifier without distortion and a real output signal of the power amplifier, and can adjust predistortion parameters accordingly for precisely performing digital predistortion.

The process 40 is described as follows. The process 40 uses a signal generator to generate M single tone signals $S_1(n) \sim S_M(n)$ sent to the channel simulation device. The single tone signal $S_M(n)$ has the maximum expected amplitude, and each of the M-1 single tone signals $S_1(n) \sim S_{(M-1)}(n)$ has an amplitude different from other of single tone signals and lower than the maximum expected amplitude. Number of the single tone signals and the maximum expected amplitude are designed depending on requirements. Linear output range of the power amplifier is decided by the maximum expected amplitude. The signal generator is, for example, a baseband IC in a communication system.

Figure 5:
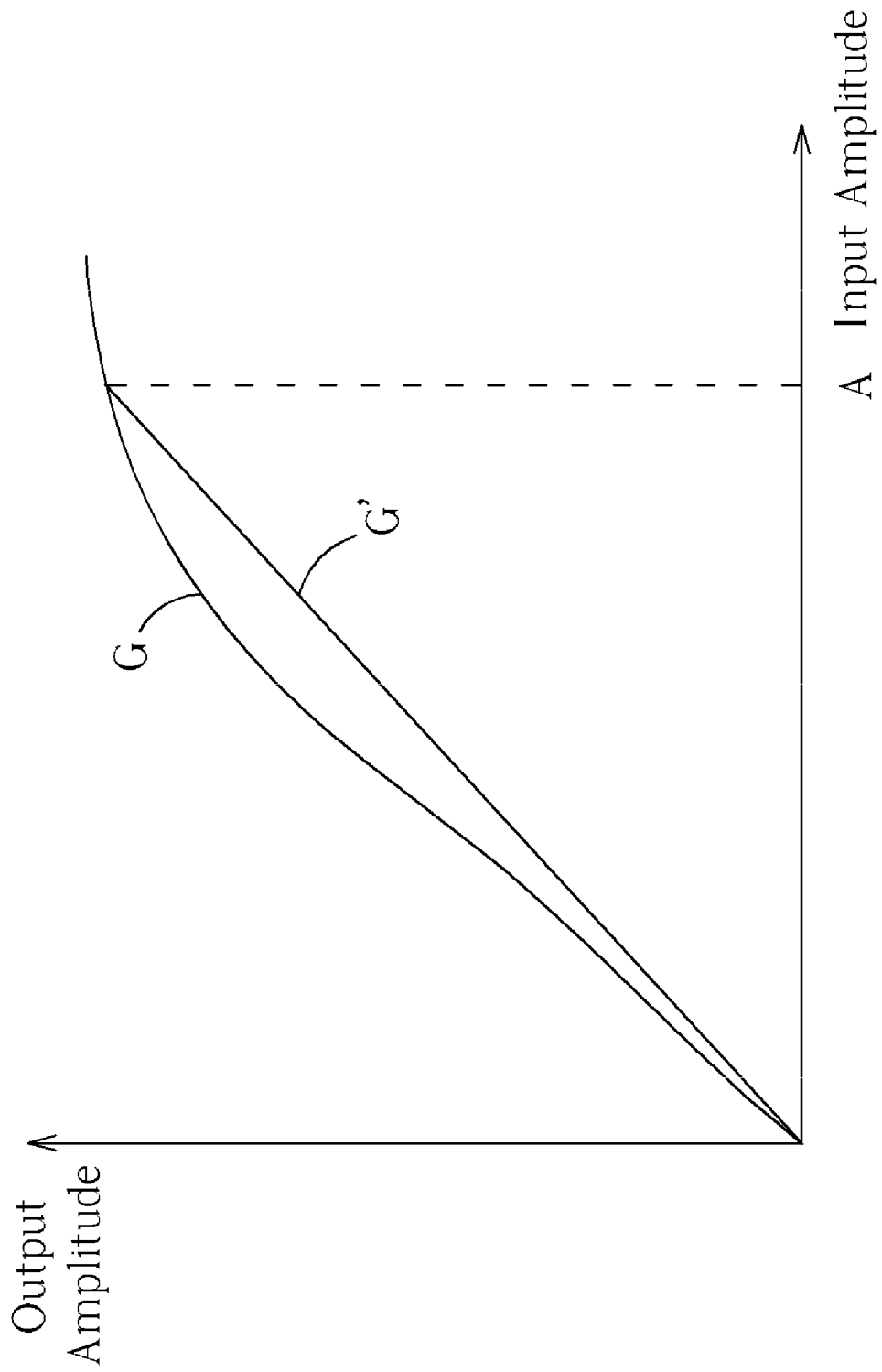
FIG. 5 is a diagram illustrating AM/AM characteristic of a power amplifier and a maximum expected amplitude according to an embodiment of the present invention.

First, the process 40 sends the single tone signal $S_M(n)$ and receives the simulation output signal $Y_M(n)$ corresponding to the single tone signal $S_M(n)$ from the channel simulation device. The single tone signal $S_M(n)$ passes through digital/analog conversion, frequency translation, amplification, and attenuation, and is transferred to the simulation output signal $Y_M(n)$. Please refer to FIG. 5, which is a diagram illustrating AM/AM characteristic of a power amplifier and the maximum expected amplitude according to an embodiment of the present invention. In FIG. 5, a point A represents the maximum expected amplitude; a curve G represents AM/AM characteristic of the power amplifier without predistortion; and a line G' represents the AM/AM characteristic of the power amplifier with predistortion by the predistorter using the process 40. In comparison, the process 40 improves output linearity of the power amplifier.

Next, the process 40 estimates the closed loop gain g and the closed loop phase β of the power amplifier according to the single tone signal $S_M(n)$ and the simulation output signal $Y_M(n)$, wherein the closed loop gain g is the slope of the line G' in FIG. 5. The closed loop gain g and the closed loop phase β can be derived from the following equations:

$$g = \frac{E\{|y(n)|\}}{E\{|s(n)|\}} \quad (1)$$

$$\beta = \angle\{E\{s^*(n)y(n)\}\} \quad (2)$$

In equations (1) and (2), s(n) is $S_M(n)$ and y(n) is $Y_M(n)$. After the closed loop gain g and the closed loop phase β are decided, the process 40 uses the signal generator to generate the single tone signals $S_1(n) \sim S_{(M-1)}(n)$ sent to the channel simulation device and receives the corresponding simulation output signal $Y_1(n) \sim Y_{(M-1)}(n)$ from the channel simulation device. Note that the amplitude of each single tone signal is different and lower than the maximum expected amplitude. In other words, the process 40 uses the signal generator to generate a training sequence of single tone signals with different amplitudes and sends the training sequence to the channel simulation device. The single tone signals $S_1(n) \sim S_{(M-1)}(n)$ pass through digital/analog conversion, frequency translation, amplification and attenuation, and are transferred to the simulation output signal $Y_1(n) \sim Y_{(M-1)}(n)$.

Figure 6:
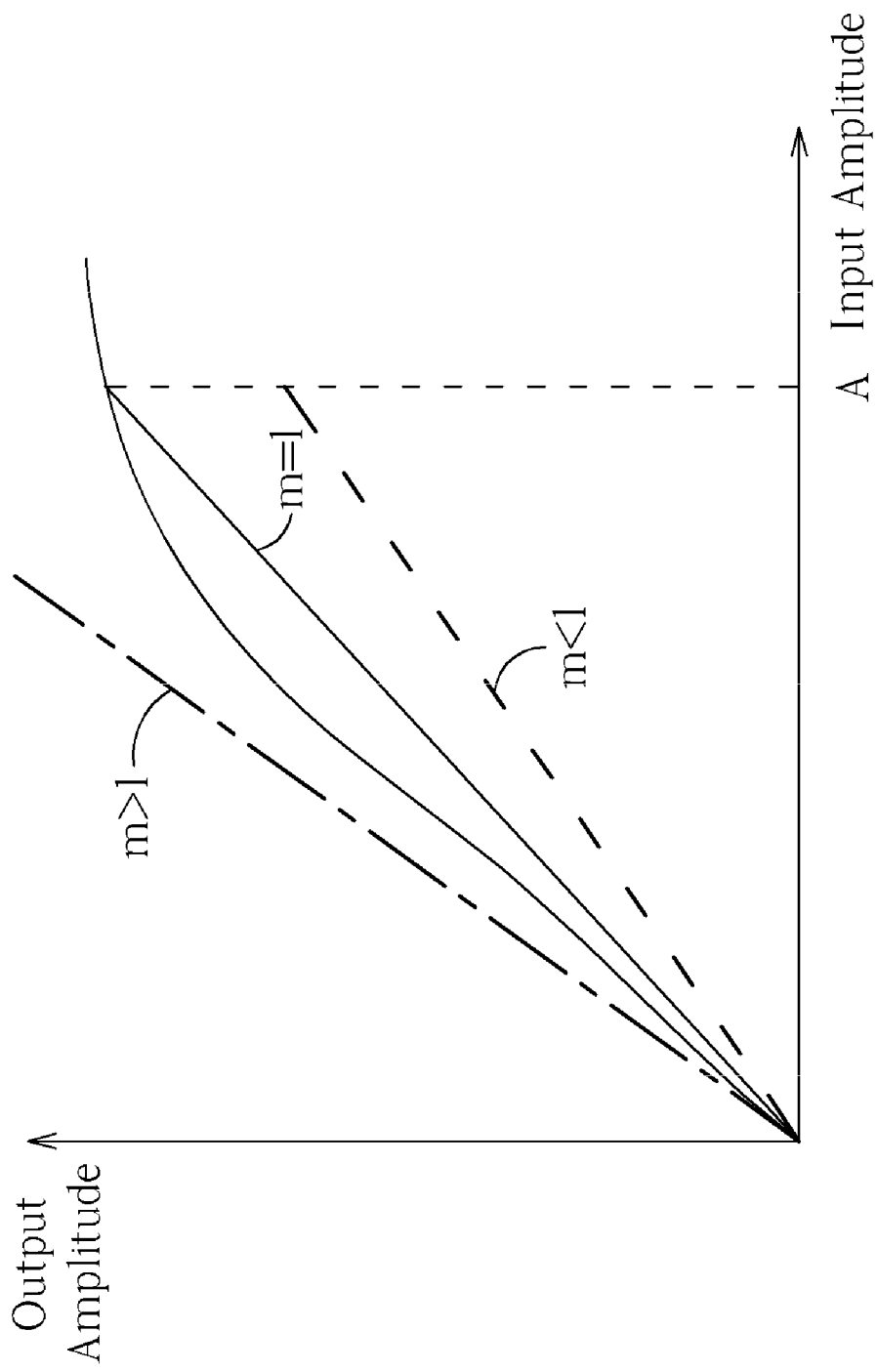
FIG. 6 is a diagram illustrating AM/AM characteristic of a power amplifier and a gain factor according to an embodiment of the present invention.

Next, the process 40 generates corresponding amplitude errors and corresponding phase errors of the single tone signals $S_1(n) \sim S_{(M-1)}(n)$ according to the closed loop gain g, the closed loop phase β, the single tone signals $S_1(n) \sim S_{(M-1)}(n)$ and the simulation output signal $Y_1(n) \sim Y_{(M-1)}(n)$. Each amplitude error and each phase error correspond to one of the single tone signals $S_1(n) \sim S_{(M-1)}(n)$. The process 40 then generates the plurality of predistortion parameters according to the amplitude errors and the phase errors by using the specific algorithm, e.g. a Least Mean Square (LMS) algorithm. Moreover, the process 40 does not only consider the closed loop gain g, the closed loop phase β, the single tone signals $S_1(n) \sim S_{(M-1)}(n)$ and the simulation output signal $Y_1(n) \sim Y_{(M-1)}(n)$, but also considers a gain factor m when generating the plurality of predistortion parameters. Please refer to FIG. 6, which is a diagram illustrating AM/AM characteristic of the power amplifier and the gain factor m according to an embodiment of the present invention. As indicated by dashed lines shown in FIG. 6, the gain factor m can change the gain of the power amplifier. If m=1, the gain of the power amplifier is equal to the closed loop gain g; if m>1, the gain of the power amplifier is increased; and if m<1, the gain of the power amplifier is decreased. The LMS algorithm is used to generate the plurality of predistortion parameters by the following equations:

$$w(n+1) = w(n) + u_g \cdot (g \cdot m \cdot |s(n)| - |y(n)|)/|s(n)| \qquad (3)$$

$$\theta(n+1) = \theta(n) + u_p \cdot L\{s(n) \cdot y^*(n)e^{j\beta}\} \qquad (4)$$

In equations (3) and (4), w(n) is the predistortion parameter for improving AM/AM characteristic and θ(n) is the predistortion parameter for improving AM/PM characteristic. Both w(n) and θ(n) are included in the plurality of predistortion parameters. s(n) is one of the single tone signals $S_1(n) \sim S_{(M-1)}(n)$; y(n) is a simulation output signal corresponding to s(n); $u_g$ and $u_p$ are coefficients; and g, β, and m are mentioned above. In other words, the embodiment of the present invention uses the LMS algorithm to generate the plurality of predistortion parameters according to each amplitude error and each phase error corresponding to each of the single tone signals $S_1(n) \sim S_{(M-1)}(n)$.

Finally, after the plurality of predistortion parameters are generated, the process 40 stores them in the lookup table. When the communication system starts operating, the predistorter selects appropriate predistortion parameters to perform predistortion on baseband signals such that AM/AM and AM/PM characteristics of the power amplifier are improved.

Note that, the process 40 is one embodiment of the present invention, and those skilled in the art can make alterations and modifications accordingly. For example, the gain factor is optional. And, Step 412 and Step 414 can be integrated into one step: generate the plurality of predistortion parameters according to the closed loop gain g, the closed loop phase β, the single tone signals $S_1(n) \sim S_{(M-1)}(n)$ and the simulation output signals $Y_1(n) \sim Y_{(M-1)}(n)$.

In summary, the embodiment of the present invention first generates the single tone signal $S_M(n)$ and the simulation output signal $Y_M(n)$ and estimates the closed loop gain g and the closed loop phase β of the power amplifier accordingly; next, the embodiment generates the single tone signals $S_1(n) \sim S_{(M-1)}(n)$ and the simulation output signals $Y_1(n) \sim Y_{(M-1)}(n)$ and generates the amplitude errors and the phase errors, each amplitude error and each phase error being generated according one of single tone signals and a corresponding simulation output signal; and finally, the embodiment generates the plurality of predistortion parameters according to the amplitude errors and the phase errors by using the LMS algorithm.

Figure 7:
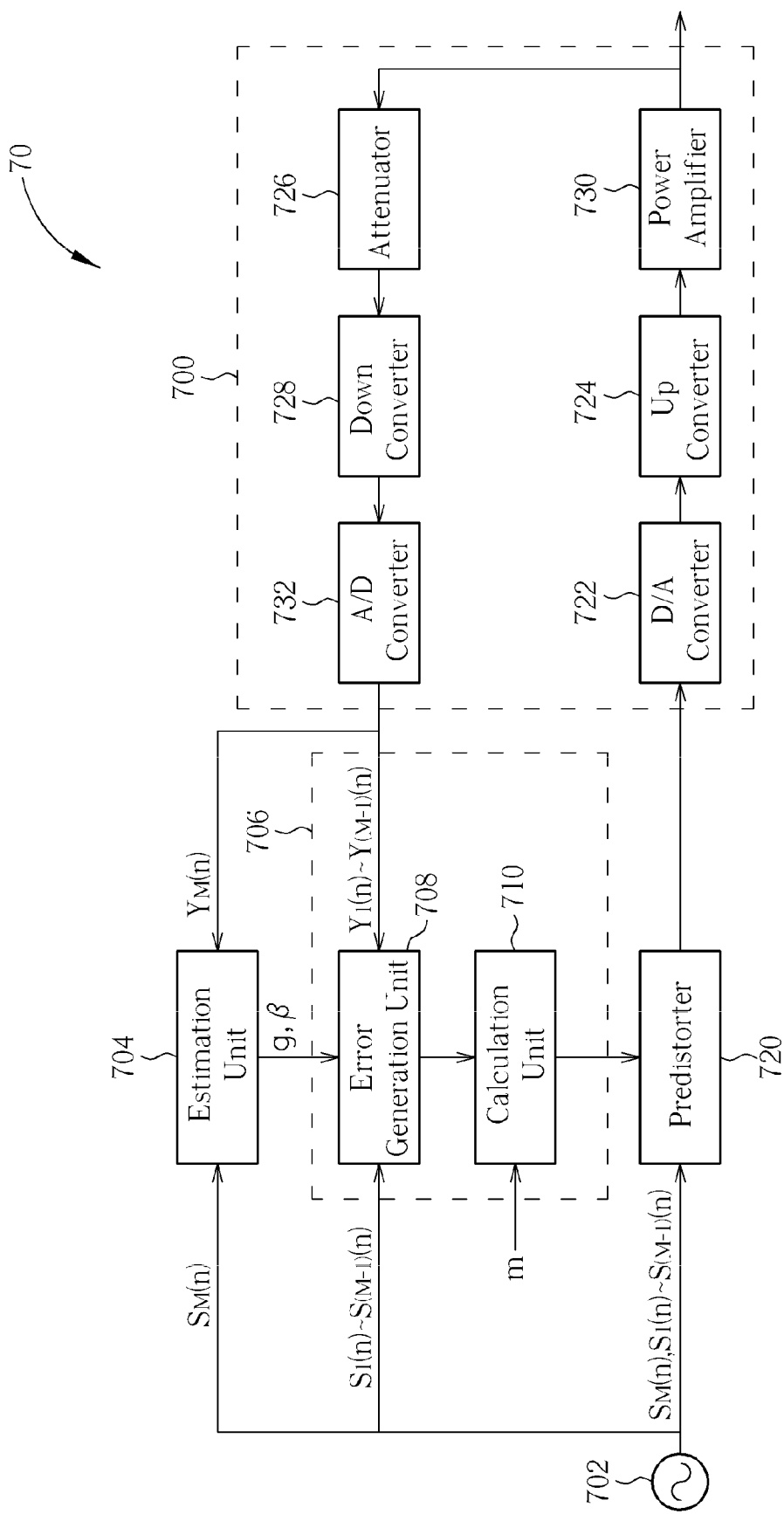
FIG. 7 is a schematic diagram of a predistortion parameter generator according to an embodiment of the present invention.

Please refer to FIG. 7 for a hardware implementation of the process 40. FIG. 7 is a schematic diagram of a predistortion parameter generator 70 according to an embodiment of the present invention. The predistortion parameters generator 70 uses the process 40 to generate predistortion parameters used by a predistorter 720 for performing predistortion on baseband signals, for improving output linearity of a power amplifier 730. The predistortion parameters generator 70 comprises a channel simulation device 700, a signal generator 702, an estimation unit 704 and a parameter generation unit 706. The channel simulation device 700 is used for simulating influences resulting from the communication system, such as amplification and attenuation, on signals. The channel simulation device 700 comprises the power amplifier 730, a digital to analog converter (DAC) 722, an up converter 724, an attenuator 726, a down converter 728 and an analog to digital converter (ADC) 732. The channel simulation device 700 includes parts of a transmitter and a receiver, and all units in the channel simulation device 700 are well-known to those skilled in the art and are not given here. The channel simulation device 700 receives the single tone signal $S_M(n)$ and generates the corresponding simulation output signal $Y_M(n)$, and also receives the single tone signal $S_1(n) \sim S_{(M-1)}(n)$ and generates the corresponding simulation output signals $Y_1(n) \sim Y_{(M-1)}(n)$. The signal generator 702 is the source for generating the single tone signal $S_1(n) \sim S_M(n)$ sent to the channel simulation device 700.

The predistorter 720 is coupled between the signal generator 702 and the channel simulation device 700. During the process 40, the predistorter 720 does not perform predistortion until the lookup table is generated so the signal generator 702 can be regarded as being coupled to the channel simulation device 700. The estimation unit 704 is coupled to the signal generator 702 and the channel simulation device 700, and is utilized for receiving the simulation output signal $Y_M(n)$ and estimating the closed loop gain g and the closed loop phase β of the power amplifier 730 according to the single tone signal $S_M(n)$ and the simulation output signal $Y_M(n)$ by equations (1) and (2) mentioned previously. The parameter generation unit 706 is coupled to the signal generator 702, the estimation unit 704 and the channel simulation device 700, and is utilized for receiving the simulation output signals $Y_1(n) \sim Y_{(M-1)}(n)$ and generating the plurality of predistortion parameters according to the closed loop gain g, the closed loop phase β, the single tone signals $S_1(n) \sim S_{(M-1)}(n)$ and the simulation output signals $Y_1(n) \sim Y_{(M-1)}(n)$ by equations (3) and (4).

The parameter generation unit 706 is described in detail as follows. The parameter generation unit 706 comprises an error generation unit 708 and a calculation unit 710. The error generation unit 708 is coupled to the channel simulation device 700, the signal generator 702 and the estimation unit 704, and is utilized for generating the amplitude errors and the phase errors corresponding to the single tone signals $S_1(n) \sim S_{(M-1)}(n)$. The calculation unit 710 is coupled to the error generation unit 708 and is utilized for generating the plurality of predistortion parameters for improving AM/AM and AM/PM characteristics of the power amplifier 730. Each predistortion parameter is generated according to an amplitude error, a phase error and the gain factor m by using the LMS algorithm shown in equations (3) and (4). The gain factor m is utilized for changing gain of the power amplifier 730, as mentioned previously.

Detailed operation of the predistortion parameters generator 70 is illustrated in the process 40 and is not repeated again. Note that, the predistortion parameters generator 70 is one embodiment of the present invention, and those skilled in the art can make alterations and modifications accordingly. For example, the main idea of the parameter generation unit 706 is generating the plurality of predistortion parameters according to the closed loop gain g, the closed loop phase β, the single tone signals $S_1(n) \sim S_{(M-1)}(n)$ and the simulation output signals $Y_1(n) \sim Y_{(M-1)}(n)$, which is not limited to be performed by the error generation unit 708 and the calculation unit 710.

In conclusion, the embodiments of the present invention estimate the closed loop gain and the closed loop phase of the power amplifier according to the single tone signal with the maximum expected amplitude, generate a training sequence of single tone signals sent to the channel simulation device, each single tone signal having amplitude lower than the maximum expected amplitude, receive the simulation output signals corresponding to the training sequence from the channel simulation device, and finally, generate the plurality of predistortion parameters according to the closed loop gain, the closed loop phase, the single tone signals and the corresponding simulation output signals. According to the embodiment of the present invention, the lookup table of the predistorter is generated more precisely and the output linearity of the power amplifier is enhanced.

Those skilled in the art will readily observe that numerous modifications and alterations of the device and method may be made while retaining the teachings of the invention.

What is claimed is:

1. A lookup table generation method for a predistorter for a power amplifier, the lookup table generation method comprising:
   sending a first single tone signal with a maximum expected amplitude to a channel simulation device including the power amplifier;
   receiving a first simulation output signal corresponding to the first single tone signal from the channel simulation device;
   estimating a closed loop gain and a closed loop phase of the power amplifier according to the first single tone signal and the first simulation output signal;
   sending a plurality of single tone signals to the channel simulation device, each single tone signal having an amplitude different from all others of the plurality of single tone signals and lower than the maximum expected amplitude;
   receiving a plurality of simulation output signals corresponding to the plurality of single tone signals from the channel simulation device;
   generating a plurality of predistortion parameters according to the closed loop gain, the closed loop phase, the plurality of single tone signals and the plurality of simulation output signals; and
   storing the plurality of predistortion parameters in a lookup table of the predistorter.

2. The lookup table generation method of claim 1, wherein the step of generating the plurality of predistortion parameters comprises:
   generating a plurality of amplitude errors and a plurality of phase errors corresponding to the plurality of single tone signals, each amplitude error and each phase error corresponding to one of the plurality of single tone signals; and
   generating the plurality of predistortion parameters according to the plurality of amplitude errors and the plurality of phase errors by a specific algorithm.

3. The lookup table generation method of claim 2, wherein the specific algorithm is a Least Mean Square algorithm.

4. The lookup table generation method of claim 1 further comprising:
   generating the plurality of predistortion parameters according to a gain factor.

5. The lookup table generation method of claim 1, wherein the plurality of predistortion parameters are utilized for improving AM/AM and AM/PM characteristics of the power amplifier.

6. A predistortion parameter generator for a power amplifier, the predistortion parameter generator comprising:
   a channel simulation device comprising the power amplifier for generating a first simulation output signal according to a first single tone signal with a maximum expected amplitude, and generating a plurality of simulation output signals according to a plurality of single tone signals, wherein each single tone signal has amplitude different from all others of the plurality of single tone signals and lower than the maximum expected amplitude;
   a signal generator coupled to the channel simulation device for generating the first single tone signal and the plurality of single tone signals sent to the channel simulation device;
   an estimation unit coupled to the channel simulation device and the signal generator for estimating a closed loop gain and a closed loop phase of the power amplifier according to the first single tone signal and the first simulation output signal; and
   a parameter generation unit coupled to the signal generator, the estimation unit and the channel simulation device for generating a plurality of predistortion parameters according to the closed loop gain, the closed loop phase, the plurality of single tone signals and the plurality of simulation output signals.

7. The predistortion parameter generator of claim 6, wherein the parameter generation unit comprises:
   an error generation unit coupled to the signal generator, the estimation unit and the channel simulation device for generating a plurality of amplitude errors and a plurality of phase errors corresponding to the plurality of single tone signals according to the closed loop gain, the closed loop phase, the plurality of single tone signals and the plurality of simulation output signals, each amplitude error and each phase error corresponding to one of the plurality of single tone signals; and
   a calculation unit coupled to the error generation unit for generating the plurality of predistortion parameters according to the plurality of amplitude errors and the plurality of phase errors by using a specific algorithm.

8. The predistortion parameter generator of claim 7, wherein the specific algorithm is a Least Mean Square algorithm.

9. The predistortion parameter generator of claim 7, wherein the calculation unit generates the plurality of predistortion parameters according to the closed loop gain, the closed loop phase, the plurality of single tone signals, the plurality of simulation output signals and a gain factor.

10. The predistortion parameter generator of claim 6, wherein the plurality of predistortion parameters are utilized for improving AM/AM and AM/PM characteristics of the power amplifier.

* * * * *